United States Patent
Kwon

(10) Patent No.: US 6,937,111 B2
(45) Date of Patent: Aug. 30, 2005

(54) DEVICE AND SYSTEM HAVING SELF-TERMINATED DRIVER AND ACTIVE TERMINATOR FOR HIGH SPEED INTERFACE

(75) Inventor: Chang Ki Kwon, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 321 days.

(21) Appl. No.: 10/293,312

(22) Filed: Nov. 14, 2002

(65) Prior Publication Data

US 2003/0124989 A1 Jul. 3, 2003

(30) Foreign Application Priority Data

Nov. 21, 2001 (KR) .................................... 2001-0072778
Jul. 20, 2002 (KR) .................................... 2002-0042771

(51) Int. Cl.[7] .............................................. H01P 5/12
(52) U.S. Cl. ........................ 333/100; 333/101; 333/124
(58) Field of Search .................. 333/100, 105, 333/130, 101, 124, 103, 104, 24 R, 32, 33, 125, 136; 326/30, 86; 455/88, 282

(56) References Cited

U.S. PATENT DOCUMENTS

| | | | |
|---|---|---|---|
| 4,713,827 A | 12/1987 | Lauffer et al. | |
| 4,748,426 A | 5/1988 | Stewart | |
| 5,822,426 A | 10/1998 | Rasmus et al. | |
| 6,222,389 B1 | 4/2001 | Williams | |
| 6,356,106 B1 * | 3/2002 | Greeff et al. ................. 326/30 |
| 6,477,205 B1 * | 11/2002 | Doblar et al. ................ 375/259 |
| 6,501,293 B2 * | 12/2002 | Braceras et al. .............. 326/30 |
| 6,577,179 B2 * | 6/2003 | Falconer ...................... 327/530 |
| 6,766,155 B2 * | 7/2004 | Salcido et al. .............. 455/282 |

FOREIGN PATENT DOCUMENTS

| | | |
|---|---|---|
| DE | 696 01 425 T2 | 3/1998 |
| DE | 101 01 066 A1 | 8/2001 |
| EP | 0 818 734 B1 | 5/2003 |

OTHER PUBLICATIONS

Thoma F. Knight, Jr. and Alexander Krymm, A self terminating low voltage seing CMOS output driver, Apr. 1988, IEEE Journal of Solid State Ciruicts, vol. 23 No. 2, pp. 457–464.*

* cited by examiner

*Primary Examiner*—Robert Pascal
*Assistant Examiner*—Kimberly E. Glenn
(74) *Attorney, Agent, or Firm*—Pillsbury Winthrop Shaw Pittman LLP

(57) ABSTRACT

A transmission line adapter for high speed interface. A receiver receives input signals via a transmission line. An active termination circuit is selectively connected to the transmission line in parallel with the receiver according to a receive condition. A self-terminated driver circuit outputs a first voltage and a second voltage according to output data. A selective circuit for selectively connects the self-terminated driver circuit to the transmission line when output of the self-terminated driver circuit is a first voltage, and selectively connects the self-terminated driver circuit or the active termination circuit to the transmission line when the output is a second voltage.

9 Claims, 5 Drawing Sheets

DEVICE AND SYSTEM HAVING SELF-TERMINATED DRIVER AND ACTIVE TERMINATOR FOR HIGH SPEED INTERFACE

BACKGROUND OF THE INVENTION

1. Field of the Invention

The present invention generally relates to a transceiver and a system for high speed interface. More particularly, the present invention relates to a transceiver and a high speed interface system: actively selecting an active termination circuit of which input impedance is matched or approximately matched to characteristic impedance of a transmission line, and connecting the active termination circuit to the transmission line; selectively connecting a self-terminated driver circuit of which output impedance is matched or approximately matched to characteristic impedance of the transmission line.

2. Description of the Prior Art

According to continuous increase of data transmission speed and clock speed in computer system, reflection wave resulting from impedance mismatching also increases. As a result, it is difficult to transmit and receive precisely data signals in high speed interface. In general, output impedance of transmitter and input impedance of receiver do not match with characteristic impedance of transmission line regardless of kinds of transmission line connected to transceiver. To overcome this problem, the conventional art uses a receiver and an open-drain driver for low swing high speed, and a method wherein single off-chip parallel termination resister of which impedance is matched to a transmission line is connected to a termination line of the transmission line.

FIG. 1 is a block diagram illustrating a conventional high speed interface system including a plurality of transceivers. A plurality of transceivers 10, 20, 30 and 40 are connected to a transmission line. In a first transceiver 10, a transmitter 12 and a receiver 15 are all illustrated, but in the rest transceivers 20, 30 and 40, receivers 25, 35 and 45 are just illustrated for the convenience of explanation. This system inevitably has parasitic capacitance cp1, cp2, ..., cpN in each stub channel and each receiver 15, 25, 35, 45. The parasitic capacitance elongates rising and falling time of transmission signals, and lowers limits operating frequency, thereby requiring extra parallel termination resistor. As a result, the system has complicated design and high fabrication cost.

As rising and falling time of transmission signals is shortened and operating frequency increases, reflection wave resulting from discontinuous point on channel including input units of receivers 15, 25, 35, 45 increases. However, if output impedance of transmitter 12 and input impedance of receivers 15, 25, 35, 45 are not matched to characteristic impedance of transmission lines, the reflection wave is not sufficiently absorbed. As a result, signal integrity of transmission signals received by receivers 15, 25, 35, 45 are remarkably degraded. Accordingly, in order to improve signal integrity, it is required to provide impedance matching or approximate matching simple and convenient in high speed interface system including a plurality of transceivers.

SUMMARY OF THE INVENTION

The present invention has an object to provide a transceiver and a high speed interface system for selectively matching or approximately matching output impedance of transceiver and input impedance of receiver to characteristic impedance of transmission line, and selectively connecting an active termination circuit to the transmission line, which reduces reflection wave and improves integrity of transmission signals at high operating frequency.

In order to accomplish the above object, there is provided a transceiver for transmitting and receiving signals via a transmission line, comprising: a receiver for receiving input signals via the transmission line; an active termination circuit for being selectively connected to the transmission line parallel with the receiver according to the receiving condition; a self-terminated driver circuit for outputting a first voltage and a second voltage according to output data; and a selective circuit for selectively connecting the self-terminated driver circuit to the transmission line when output of the self-terminated driver circuit is a first voltage, and for selectively connecting the self-terminated driver circuit or the active termination circuit to the transmission line when the output is a second voltage, wherein input impedance combining the receiver with the active termination circuit and output impedance of the self-terminated driver circuit are matched or approximately matched to characteristic impedance of the transmission line.

There is also provided a high speed interface system comprising a control circuit for controlling a plurality of transceivers interconnected via a transmission line for transmitting and receiving signals, wherein the transceiver comprises a self-terminated driver circuit for matching or approximately matching output impedance to characteristic impedance of the transmission line and an active termination circuit for matching or approximately matching input impedance combined with a transmitter to characteristic impedance of the transmission line; and wherein the control circuit selectively activates the self-terminated driver circuit of the transceiver when transmitting signals of specific voltage level via the transmission line, and selectively activates the active termination circuit of the transceiver when receiving signals from the transmission line.

DETAILED DESCRIPTION OF THE PREFERRED EMBODIMENTS

The present invention will be explained in terms of exemplary embodiments described in detail with reference to the accompanying drawings, which are given only by way of illustration and thus are not limitative of the present invention.

Figure 1:
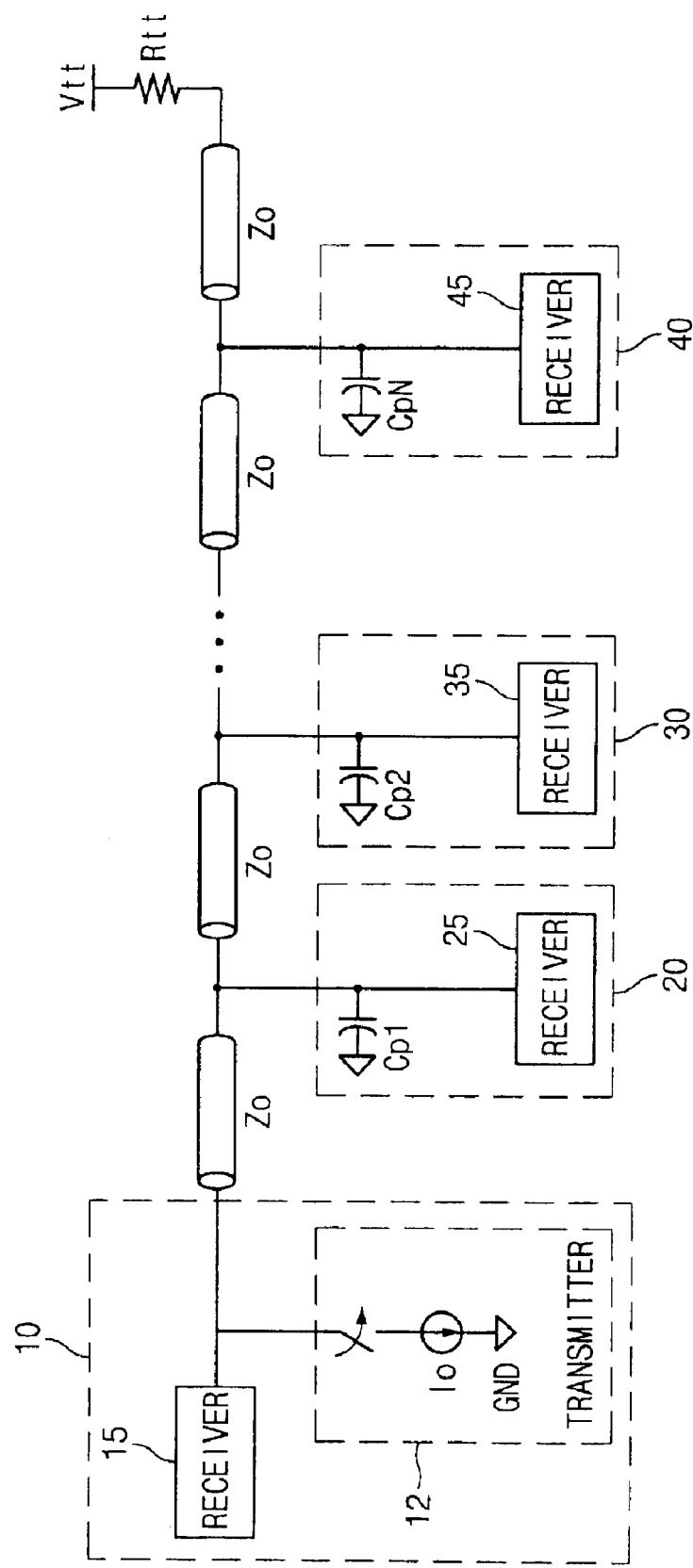
FIG. 1 is a block diagram illustrating a conventional high speed interface system.
Figure 2:
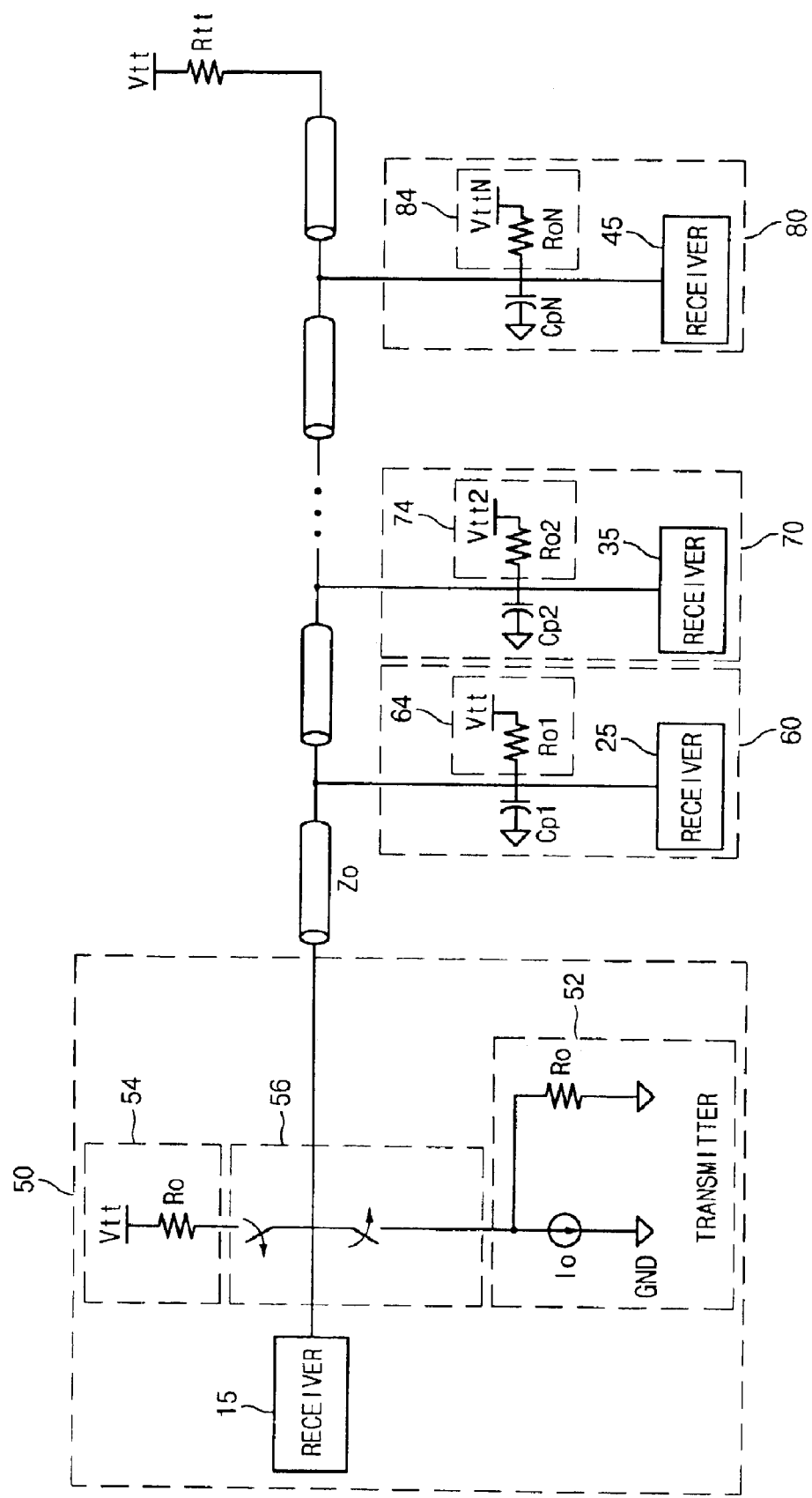
FIG. 2 is a block diagram illustrating a high speed interface system in accordance with a preferred embodiment of the present invention.

FIG. 2 is a block diagram of a high speed interface system wherein a plurality of transceivers are connected via a transmission line in accordance with a preferred embodiment of the present invention. For the convenience of explanation, a self-terminated driver circuit 52 and a selective circuit 56 are illustrated only in transceiver 50, but the rest transceivers 60, 70, 80 also the same structure as the transceiver 50.

The transceiver 50 of the present invention comprises a self-terminated driver circuit 52, an active termination circuit 54 and a selective circuit 56. The self-terminated driver circuit 52 is shown as an equivalent circuit wherein an independent current source Io and an equivalent resistance Ro are in parallel connected to a transmission line Zo. Resistance Ro of the equivelant circuit determines a resistance value Ro so that output impedance Ro can be matched ($Z_0=R_0$) or approximately matched ($5Z_0>R_0>Z_0$ or ($Z_0/5$) $<R_0<Z_0$) to characteristic impedance when the self-terminated driver circuit 52 is viewed from transmission line Zo in order to minimize reflections of output signals to transmission line. The self-terminated driver circuit 52 matches or approximately matches output impedance of transceivers 50, 60, 70, 80 to characteristic impedance of transmission lines. As a result, the circuit 52 can remarkably reduce reflections generated from input units when transceivers 50, 60, 70, 80 output electronic signals of a predetermined level into a transmission line, in comparison with a conventional transceiver wherein impedance is not matched.

Active termination circuits 54, 64, 74, 84 are connected to a transmission line parallel with receivers 15, 25, 35, 45 of transceivers 50, 60, 70, 80 respectively. Impedance of active termination circuit 54, 64, 74, 84 is selected to match or approximately match input impedance combining active termination circuits 54, 64, 74, 84 with receivers 15, 25, 35, 45 to characteristic impedance Zo of the transmission line. The active termination circuits 54, 64, 74, 86 can be equivalent to resistance Ro having their terminals connected to end voltages Vtt. Output Impedance of the self-terminated driver circuit 52 as well as input impedance of the active termination circuits 54, 64, 74, 84 in transceivers 50, 60, 70, 80 are matched or approximately matched to characteristic impedance of transmission lines. As a result, transceivers 50, 60, 70, 80 can remarkably reduce reflections generated from input units when receiving electronic signals of a predetermined level into a transmission line, in comparison with a conventional transceiver wherein impedance is not matched.

A selective circuit 56 transforms impedance of transceivers 50, 60, 70, 80 to be fit for electronic environment of a transceiving system. The transceiving system changes according to output condition of electronic signals at a predetermined level. In other words, when the transceiver 50 outputs electronic signals of a predetermined level into a transmission line, output impedance selectively connects the self-terminated driver circuit 52 or the active termination circuit 54 to the transmission line. The circuit 52 is matched or approximately matched to characteristic impedance of the transmission line. When the transceiver 50 receives electronic signals of a predetermined level via the transmission line, input impedance selectively connects the active termination circuit 54 matched or approximately matched to characteristic impedance of the transmission line.

Figure 3:
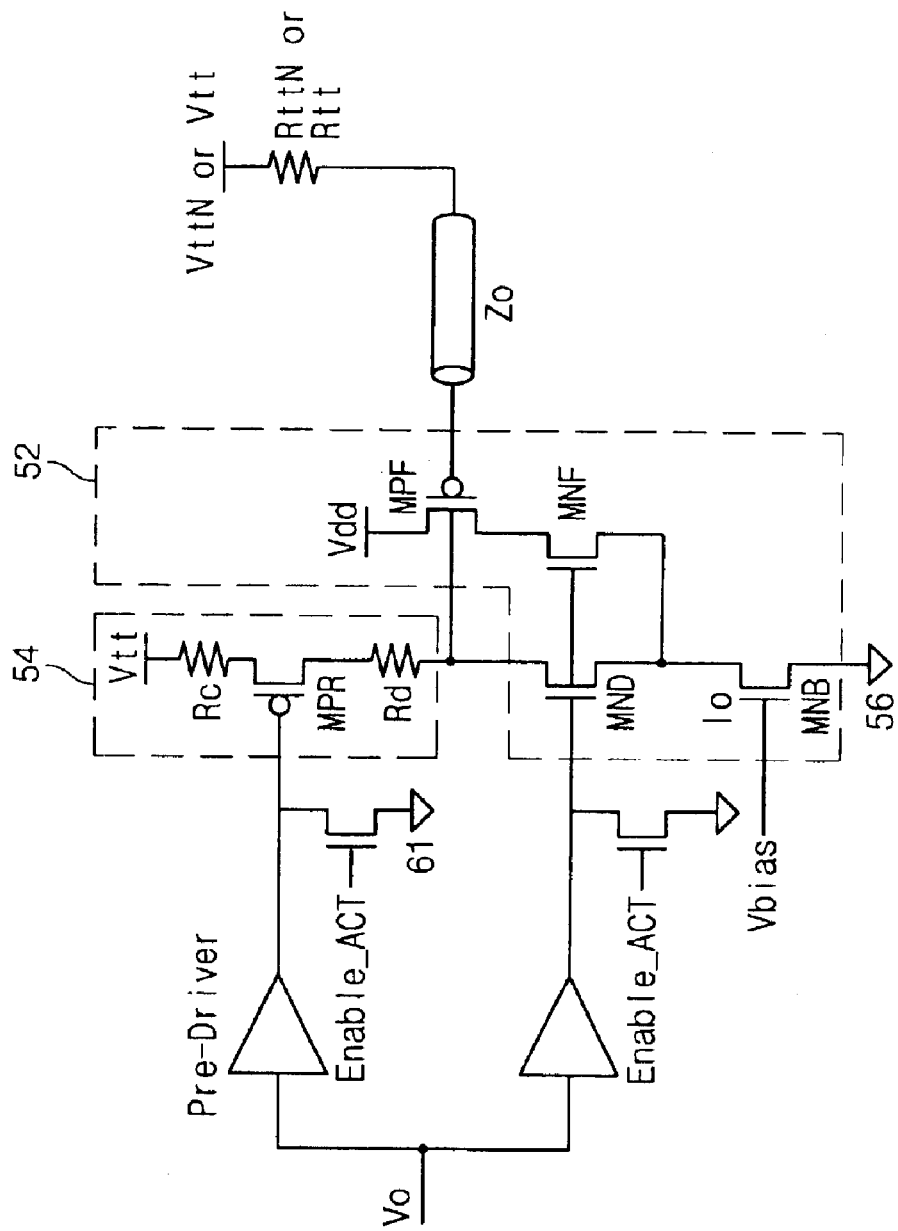
FIG. 3 is a circuit diagram of transceiver in accordance with a preferred embodiment of the present invention.
Figure 4:
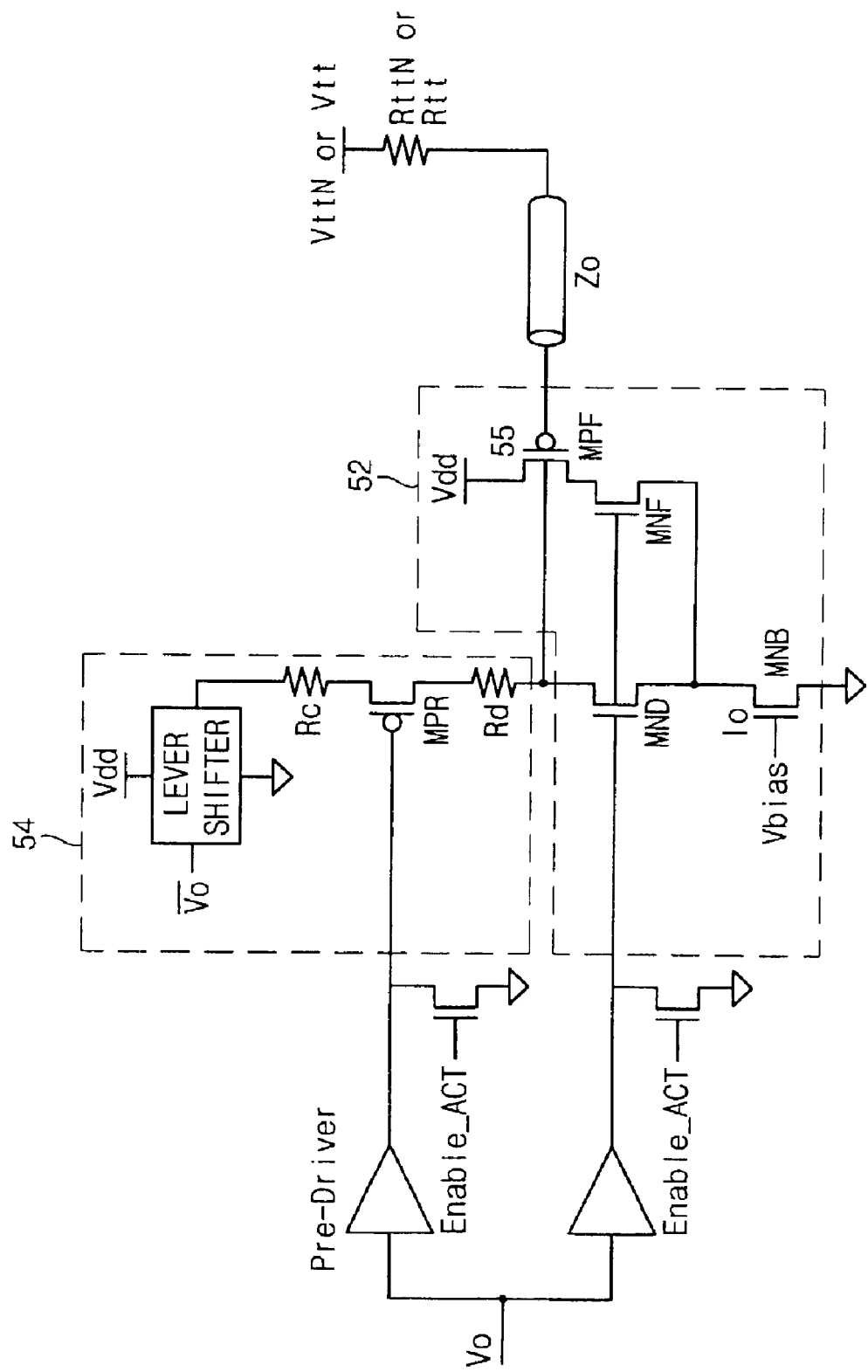
FIG. 4 is a circuit diagram of transceiver in accordance with another preferred embodiment of the present invention.

More desirably, selective operations between the self-terminated driver circuit 52 and the active termination circuit 54 in the selective circuit 56 are alternatively performed. According to a preferred embodiment of the present invention, the selective circuit 56 is formed to select one of the active termination circuit 54 and the self-terminated driver circuit, but it can be formed to select both of them simultaneously. In addition, the selective circuit of the preferred embodiment can be located adjacent to the transmission line, as shown in FIG. 2, but it may be embodied into electronically equivalent circuit, located adjacent to a power rail as shown in FIGS. 3 and 4. In this case, passive elements improve linearity of termination circuits. In order to simplify the structure of the transceiver, the transceiver is designed to share the partial structure of impedance devices of the self-terminated driver circuit 52 and the active termination circuit 54. The common portion is constantly connected to the transmission line regardless of selective operation of the selective circuit 56.

The transceiver 50 according to the present invention is explained hereinafter. First, in case of 1-to-1 interface, data is transmitted from the transceiver 50 to the transceiver 80. The selective circuit 56 of the transceiver 50 as a transmitter connects the self-terminated driver circuit 52 or the active termination circuit 54 to the transmission line to transmit electronic signals of a predetermined level. The selective circuit of the transceiver 80 as a receiver connects the active termination circuit 84. Here, the self-terminated driver circuit is not connected to the transmission line by the selective circuit. The transceivers 60 and 70, which is not involved in transmitting and receiving operation, may connect both active termination circuits 64 and 74 to the transmission line or may not connect both.

More desirably, the transceiver 80 as a receiver does not connect the active termination circuit 84 to the transmission line while other transceivers 60 and 70, which are not involved in transmitting and receiving operation, connect approximately matched active termination circuits 64 and 74. As a result, the present invention can minimize signal reflections resulting from impedance mismatching of transmission line and transceivers 60 and 70, thereby providing integral signals to the transceiver as a receiver.

In case of 1-to-N interface, when outputting electronic signals of a predetermined voltage, the selective circuit 56 as a transmitter connects the self-terminated driver circuit 52 or the active termination circuit 54 to the transmission line, and the rest selective circuits as receivers connect termination circuits to the transmission line. According to the above operation, output impedance of the driver circuit 52 and characteristic impedance of the transmission line can be precisely matched or approximately matched, thereby absorbing considerably reflections flowed from the transmission line. Additionally, termination circuits 65, 75, 85, which are in parallel connected to receivers 25, 35, 45 respectively, are used as terminations within chips, thereby minimizing reflections.

Resistance is illustrated as an element for impedance matching in a preferred embodiment of the present invention. However, impedance can be matched or approximately matched using passive elements such as capacitive or inductive elements as well as active element such as transistors.

The transceiver of the present invention has input/output impedance matched or approximately matched to characteristic impedance of the transmission line Accordingly, the transceiver having the above-described structure can be used in an interface system without a stub channel, an external end voltage Vtt and an external termination resistance Rtt to connect external parallel termination resistance.

FIG. 3 is a circuit diagram illustrating a first preferred embodiment wherein a transceiver 50 of the present invention is embodied using CMOS. The transceiver 50 comprises a self-terminated driver circuit 52, an active termination circuit 54 and a selective circuit. The self-terminated driver circuit 52 is embodied into negative feedback circuits such as MND, MPF and MNF, a bias voltage source Vbias and a transistor MNB. The termination circuit 54 is embodied into passive resistance elements such as Rc, Rd, a transistor MPR and an end voltage source VTT. The selective circuit is embodied into a plurality of transistors such as MPR, MND and MNF.

The transistor according to the first preferred embodiment is operated as follows. If an input voltage Vo of high level is applied to output electronic signals of a predetermined voltage into a transmission line, the NMOS transistor MND forming the selective circuit through a pre-driver is turned on, and the negative feedback circuit 52 is connected to the transmission line using a initial bias current Io. Here, the PMOS transistor MPR forming the selective circuit is not turned on, the termination circuit 54 is not connected to the transmission line. The transistor MND of the negative feedback circuit 52 has its drain wherein the amount of current left after current of transistors MNF and MPF is subtracted from the bias voltage Io flows.

Next, if an input voltage Vo of low level is applied, the PMOS transistor MPR forming the selective circuit through a pre-driver is turned on, and the circuit 52 connects the termination circuit 54 to the transmission line. Here, the NMOS transistors MND and MNF forming the selective circuit is not turned on. As a result, the self-terminated driver circuit 52 is not connected to the transmission line. The transistor MPR of the termination circuit 54 serves as an equivalent resistance inserted between the end voltage Vtt and the transmission line. The circuit 54 further comprises a resistant element Rc between Vtt and MPR, and a resistant element Rd between MPR and the transmission line.

When the transceivers 50, 60, 70, 80 of the present invention are used as termination resistance within chips, the active termination circuit 54 is connected to the transmission line via extra control signals by force. In the preferred embodiment, a method of applying extra control signals Enable_Act to transistors inserted between the pre-driver and selective circuits MPR and MND is used in order to connect the termination circuit 54 to the transmission line regardless of the input voltage Vo. For example, if Enable-Act of high level is applied, the transistor MPR is turned on regardless of input voltage Vo, and the active termination circuit 54 is selectively connected to the transmission line. Here, Enable_Act may be generated from transceivers 50, 60, 70, 80, respectively or from extra controllers for controlling each transceiver.

FIG. 4 is a diagram illustrating a second preferred embodiment of transceiver according to the present invention. Unlike the circuit of FIG. 3, in the second preferred embodiment, a Vdd voltage is transformed into a voltage corresponding to Vtt of FIG. 3 using a level shifter, and then applied to the active termination circuit 54. Due to the above structure, it is not necessary to apply extra Vtt to the circuit 54, thereby simplifying the structures of transceivers 50, 60, 70, 80. The circuit operation is not explained because the operation is identical to the preferred embodiment of FIG. 3. More desirably, this example can prevent power consumption in the active termination circuit 54 when the circuit 54 is not connected to the transmission line, by using complementary signals of input voltage Vo to activate the level shift.

Figure 5:
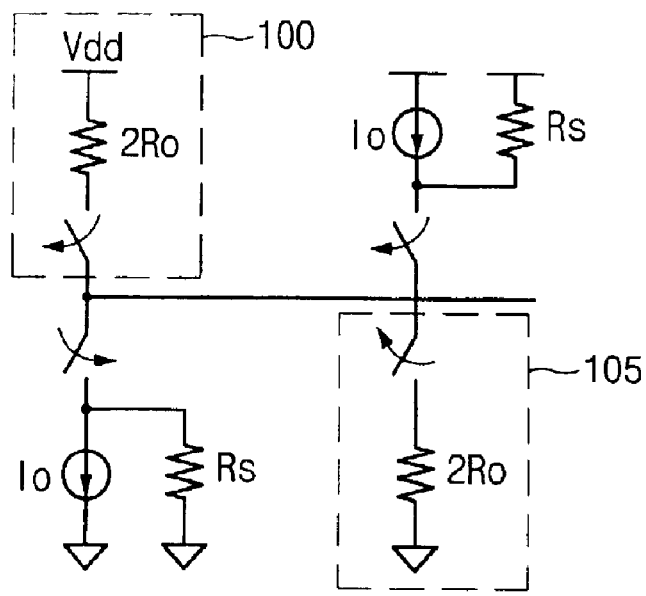
FIG. 5 is an equivalent circuit diagram in accordance with a preferred embodiment of the present invention embodied into a bipolar current mode driver circuit and an active termination circuit.

FIG. 5 illustrates a preferred embodiment wherein a self-terminated driver circuit 52 and an active termination circuit 54 in transceivers 50, 60, 70, 80 of the present invention are embodied into bipolar current mode circuit The present invention can embody self-terminated driver circuits, which operate even in complex bipolar current mode drivers according to the same principle, and a termination circuits 100 and 105, which are in parallel connected to each self-terminated driver circuit, as well as unipolar current mode drivers. For example, when outputting signals into a transmission line, a transceiver connects a self-terminated driver circuit of a bipolar current mode to the transmission line. When receiving signals via the transmission line or used as a termination within a chip, the transceiver selectively connects the active termination circuit to the transmission line.

Figure 6:
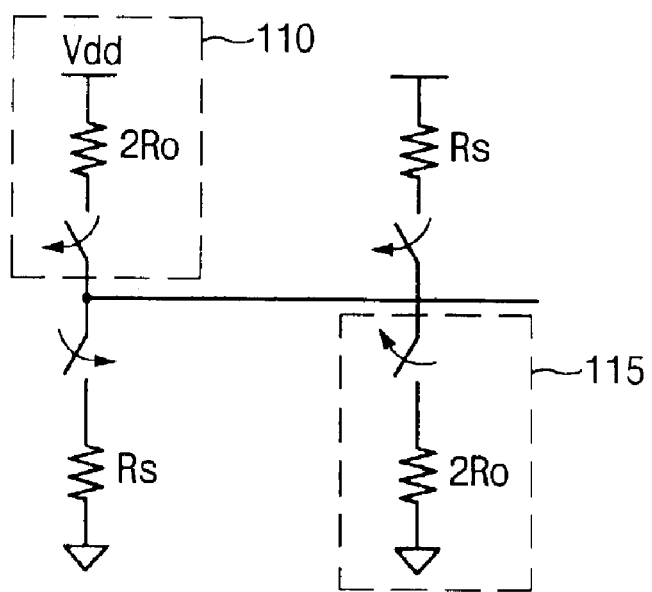
FIG. 6 is an equivalent circuit diagram in accordance with a preferred embodiment of the present invention embodied into a bipolar voltage mode driver circuit and an active termination circuit.

FIG. 6 illustrates another preferred embodiment of the present invention embodying a self-terminated driver circuit and an active termination circuit having an extended form. According to the present invention, a device can be embodied using the same principle in a conventional voltage mode driver circuit as well as in a conventional current mode driver circuit.

As shown in FIGS. 4 and 5, a termination circuit may be embodied into an equivalent resistance using a method of connecting active and passive elements of transistors in series or in parallel. Here, passive elements determine linearity of termination circuits.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

As discussed earlier, a transceiver and a high speed interface system according to the present invention can accurately match or approximately match output impedance of driver circuits to channel impedance. As a result, the present invention can minimize reflections flowed from channels by selectively using active termination circuits of transmission line connection device connected to receivers in parallel as chip-in-terminations. When data is transmitted/received on various kinds of transmission line at a high speed, the present invention can improve signal integrity in a high speed interface in comparison with a conventional driver circuit using external parallel termination resistance. Additionally, the present invention can simplify the whole system structure and reduce the production cost because it does not use external parallel termination resistance by using active termination circuits properly.

What is claimed is:

1. A transceiver for transmitting and receiving signals via a transmission line, comprising:

a receiver for receiving input signals via the transmission line;

an active termination circuit for being selectively connected to the transmission line parallel with the receiver according to a receiving condition;

a self-terminated driver circuit for outputting a first voltage and a second voltage according to output data; and a selective circuit for selectively connecting the self-terminated driver circuit to the transmission line when output of the self-terminated driver circuit is the first voltage, and for selectively connecting the self-terminated driver circuit or the active termination circuit to the transmission line when the output is the second voltage, wherein input impedance combining the receiver with the active termination circuit and output impedance of the self-terminated driver circuit are matched or approximately matched to characteristic impedance of the transmission line, wherein the self-terminated driver circuit shares a common structure portion with the active termination circuit, and wherein the common structure portion is connected to the transmission line regardless of operation of the selective circuit.

2. The transceiver according to claim 1, wherein the selective circuit selectively connects the active termination circuit to the transmission line using control signals when the transceiver does not transmit or receive data.

3. The transceiver according to claim 2, wherein the control signals are generated from an internal or external control circuit of the transceiver.

4. The transceiver according to claim 1, wherein the self-terminated driver circuit matches or approximately matches output impedance to characteristic impedance of the transmission line using a negative feedback circuit, and the active termination circuit matches or approximately matches input impedance to characteristic impedance of the transmission line using active elements, passive elements, or a combination of them.

5. The transceiver according to claim 1, wherein the first voltage is not 0V for indicating a specific logic state, and the second voltage is 0V for indicating a contrary logic state to the specific logic state.

6. The transceiver according to claim 1, wherein the self-terminated driver circuit is embodied into one of a unipolar current mode driver circuit, a bipolar current mode driver circuit, a unipolar voltage mode driver circuit or a bipolar voltage mode driver circuit; and wherein the active termination circuit is embodied into one of a unipolar active termination circuit or a bipolar active termination circuit.

7. A high speed interface system comprising a control circuit for controlling a plurality of transceivers interconnected via a transmission line for transmitting and receiving signals, wherein each of the plurality of transceivers comprises a self-terminated driver circuit for matching or approximately matching output impedance to characteristic impedance of the transmission line and an active termination circuit for matching or approximately matching input impedance combined with a transmitter to characteristic impedance of the transmission line;

wherein the control circuit selectively activates the self-terminated driver circuit of the transceiver when transmitting signals of specific voltage level via the transmission line, and selectively activates the active termination circuit of the transceiver when receiving signals from the transmission line;

wherein the self-terminated driver circuit shares a common structure portion with the active termination circuit; and wherein the common structure portion is connected to the transmission line regardless of operation of the control circuit.

8. The high speed interface system according to claim 7, wherein the control circuit selectively activates the active termination circuit when the transceiver does not transmit or receive data via the transmission line.

9. The high speed interface system according to claims 7 or 8, wherein the control circuit connects the active termination circuit to the transmission line when the active termination circuit is included in a transceiver which transmits or receives data via the transmission line and the control circuit further connects the self-terminated driver circuit to the transmission line when the self-terminated driver circuit is included in a transceiver which receives data via the transmission line.

* * * * *